United States Patent
Karpman et al.

(10) Patent No.: US 6,534,340 B1
(45) Date of Patent: *Mar. 18, 2003

(54) COVER CAP FOR SEMICONDUCTOR WAFER DEVICES

(75) Inventors: Maurice S. Karpman, Brookline, MA (US); Dipak Sengupta, Boxboro, MA (US)

(73) Assignee: Analog Devices, Inc., Norwood, MA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/195,279

(22) Filed: Nov. 18, 1998

(51) Int. Cl.[7] ................................................ H01L 21/48
(52) U.S. Cl. ........................ 438/113; 438/118; 438/458; 438/460
(58) Field of Search ................................. 257/417, 419, 257/693, 702, 704, 432, 433, 434; 438/110, 113, 118, 119, 458, 33, 29, 68, 69, 459, 460

(56) References Cited

U.S. PATENT DOCUMENTS

| | | | |
|---|---|---|---|
| 4,176,003 A | * | 11/1979 | Brower et al. ............... 430/313 |
| 5,219,794 A | * | 6/1993 | Satoh et al. |
| 5,250,798 A | * | 10/1993 | Iizuka et al. ............. 250/208.1 |
| 5,323,051 A | | 6/1994 | Adams et al. ............... 257/417 |
| 5,545,912 A | | 8/1996 | Ristic et al. ................. 257/417 |
| 5,591,679 A | * | 1/1997 | Jakobsen et al. |
| 5,604,160 A | | 2/1997 | Warfield ....................... 438/113 |
| 5,710,081 A | * | 1/1998 | Tunker ......................... 501/21 |
| 5,798,557 A | * | 8/1998 | Salatino et al. .............. 257/416 |
| 5,801,068 A | * | 9/1998 | Sooriakumar et al. |
| 5,825,092 A | * | 10/1998 | Delgado et al. |
| 5,849,221 A | * | 12/1998 | Yukinobu et al. ......... 252/519.3 |
| 5,877,492 A | * | 3/1999 | Fujieda et al. ........... 250/208.1 |
| 5,919,607 A | * | 7/1999 | Lawandy |
| 6,008,070 A | * | 12/1999 | Farnworth ................... 438/114 |
| 6,222,279 B1 | * | 4/2001 | Mis et al. .................... 257/779 |

FOREIGN PATENT DOCUMENTS

JP    5-270953    * 10/1993

OTHER PUBLICATIONS

IBM Technical Disclosure, "Preparation of Vias in Photosensitive Glass Layers", vol. 26, Aug. 1983.*

(List continued on next page.)

Primary Examiner—David L. Talbott
Assistant Examiner—Alonzo Chambliss
(74) Attorney, Agent, or Firm—Wolf, Greenfield & Sacks P.C.

(57) ABSTRACT

A cover cap for semiconductor wafer devices is disclosed. According to the invention, a wafer of material that is at least one of photo-etchable or transparent is patterned and attached as a cover to a substrate including a number of semiconductor devices. Preferably, the cover wafer is made from a photo-etchable material so that portions of the cover wafer may be selectively sensitized and etched. In particular, one or more cover caps may be defined in the cover wafer such that each cover cap corresponds to a respective device on the device substrate. Once the cover wafer is attached to the device substrate to form an assembly, the assembly is diced into individual devices and the devices are packaged. The invention provides several advantages for a number of semiconductor device fabrication applications, including those relating to image sensors, and micro-machined devices such as MEMS. For example, a cover wafer attached to the device substrate prior to dicing and packaging of individual devices provides more robust devices by protecting the device substrate from any number of environmental hazards, such as particulate contamination, moisture, processing agents such as solvents, and inadvertent scratching of the device substrate surface.

36 Claims, 7 Drawing Sheets

OTHER PUBLICATIONS

Glass–on–Chip package for CCDs, Maurice S. Karpman and Chris Reiche, Polaroid Corporation, Micro–Electronics Laboratory, SPIE vol. 1999 Adhesives Engineering (1993), pp. 63–67.

Web–Site Disclosure: IMT—Applied Optics—Micro-optics—Technology Concepts, pp. 1–2.

Web–Site Disclosure: Barr Associates, Inc., Advanced Programs Group, Optical filter technology for space–based instrument applications, Frank Woodberry, pp. 1–2.

Web–Site Disclosure: Microlents Array, Rochester Photonics Corporation, Applications, pp. 1–2.

Foturan—a material for microtechnology, Schott Corporation, William J. McLaughlin, The microstructing process, pp. 1–4.

* cited by examiner

COVER CAP FOR SEMICONDUCTOR WAFER DEVICES

FIELD OF THE INVENTION

The present invention relates to semiconductor devices, and more particularly, to a patternable protective cover for a semiconductor wafer substrate, wherein one or more devices reside on and may be fabricated from the semiconductor substrate.

BACKGROUND OF THE INVENTION

A variety of semiconductor devices may be implemented on a substrate according to several known techniques. The semiconductor devices may perform, for example, electrical, mechanical, optical, or other functions, or combinations of such functions.

Often, a semiconductor wafer serves as a substrate for such devices. The devices may be fabricated from the semiconductor material of the substrate wafer itself using a variety of known processes, such as growth of various material layers on a surface of the substrate, ion implantation, diffusion, oxidation, photolithography, etching and many other processes. During fabrication, typically at least some portion of each device is formed "within" the substrate wafer, below the surface of the substrate, and may additionally include particular topographic or structural features near the substrate surface.

Alternatively, semiconductor devices may be fabricated from a first semiconductor wafer, and subsequently mounted on a second semiconductor wafer or other type of material that serves as a substrate. The semiconductor devices fabricated from the first wafer may be mounted on the substrate either as individual devices or groups of devices. In this case, the devices "reside on" the substrate, as opposed to being "fabricated from" the substrate, as discussed above.

For purposes of the present invention, either of the foregoing examples of substrates, namely, substrates on which semiconductor devices reside, and/or from which semiconductor devices are fabricated, is referred to as a "device" substrate. A device substrate may include one or a large number of devices.

Many known semiconductor devices are extremely fragile and/or sensitive to environmental hazards. Some examples of such hazards include contamination by dust or other particulates, moisture, and inadvertent scratching or other damage to portions of the surface of the devices that include "active" areas. An active area of a device generally refers to a functional region such as an electrical contact, a semiconductor junction, an optically sensitive area, or a micro-mechanical structure.

Functional defects may result from one or more environmental hazards, as discussed above, and are a major cause of low device yield and other malperformance characteristics. Device damage due to any number of such hazards may occur, for example, during the process of "dicing" (separating the device substrate into individual devices), as well as during packaging of devices. Often, the number of functioning devices remaining after dicing and packaging is markedly reduced due to defects resulting from environmental hazards.

Various techniques are known in the art for protecting semiconductor devices on a substrate from such hazards. Some of these techniques include bonding a protective semiconductor cap wafer to a device substrate before dicing the substrate into individual devices. This technique has been employed particularly with wafer substrates of semiconductor devices that include micro-machined parts or microscopic mechanisms fabricated on the surface of the substrate, such as micro-electrical-mechanical systems or MEMS.

According to one known technique for protecting semiconductor micro-mechanical devices, an entire device substrate wafer is capped with another wafer using a pattern of glass-like "posts" or "frit glass" as a bonding agent. In this technique, the micro-mechanical devices are hermetically sealed inside an open cavity formed by the frit glass pattern, the device substrate and the cap wafer. Accordingly, any micro-mechanisms are free to move while simultaneously being protected from various environmental hazards, such as particulate contamination.

According to the technique discussed above, the cap wafer is typically another semiconductor wafer of the same type as that used for the device substrate (for example, silicon or gallium arsenide). As a result, the cap wafer has essentially identical thermal characteristics to that of the device substrate. This choice of cap wafer avoids most mechanical stresses that may result from a thermal mismatch between the cap wafer and the device substrate. For example, extreme mechanical stress can occur during a high temperature heat treatment necessary to ensure adequate bonding of the frit glass to the cap wafer and the device substrate. Any mechanical stress can severely damage or even destroy the devices on the substrate, and would especially degrade the accuracy of many delicate micro-machined devices, such as microscopic mechanical sensors or other MEMS.

It is also noteworthy in the technique discussed above that any processing steps required for fabrication of the cap wafer are performed before the cap wafer is bonded to the device substrate. For example, in some instances, one or more holes which extend completely through the cap wafer are provided by drilling or anisotropic etching, so as to allow for electrical connections to the devices on the device substrate. These drilling or etching steps are performed before assembly of the cap wafer and the device substrate, so as to avoid damage to the delicate micro-mechanical devices on the substrate.

Another known protective packaging technique has been employed with semiconductor image sensors. This technique differs from the protective capping technique used for micro-mechanical devices, as discussed above. In the technique for protecting micro-mechanical devices, an entire device substrate of micro-mechanical devices is protected with a cap wafer before dicing. In contrast, in the technique for protecting image sensors, each discrete image sensor is individually equipped with a protective glass cap after the image sensor has been separated from the device substrate. The image sensor protection technique also differs from the micro-mechanical device protection technique in that the protective cap must be transparent to a variety of radiation wavelengths, and more specifically, to a particular radiation wavelength range of interest so that the image sensors are not blocked from receiving the radiation of interest.

According to one technique for protecting semiconductor image sensors, each individual image sensor is bonded in a cavity package, such as a ceramic package, and the protective glass cover is attached to the package with an optically compatible adhesive that substantially underfills the glass cover.

There are a number of drawbacks to this approach. First, the image sensor surface is exposed during the entire packaging operation, and therefore it is still vulnerable to damage from several types of environmental hazards, including particulate contamination. Second, any particles trapped in the package after the glass cover is attached can lead to unpredictable in-use failure of the image sensor at some later time. Third, the protective glass caps must be individually fabricated and individually attached, which is expensive. In addition, this technique cannot be readily implemented with micro-mechanical devices, because the adhesive underfills the protective glass cap and leaves essentially no open cavity to allow useful movement of a micro-mechanism.

SUMMARY OF THE INVENTION

In view of the foregoing, it would be advantageous to protect semiconductor devices, such as image sensors, on a "wafer" level; namely, simultaneously protecting one or more devices residing on or fabricated from a device substrate, as opposed to protecting individual devices after the device wafer has been diced. While such a wafer level technique has been employed with micro-mechanical devices by using a semiconductor cap wafer, as discussed above, the capping technique employed for micro-mechanical devices does not permit exposure of the devices to various radiation wavelength ranges of interest, as would be necessary for image sensor applications, because the semiconductor cap wafer has only a specific transparency to a particular wavelength range (typically infrared radiation). Furthermore, it would be advantageous to protect a variety of semiconductor devices, including image sensors and micro-mechanical devices, with an easily patternable protective cover that can be attached to a device substrate in a manner that avoids mechanical stress, and in particular, thermally induced mechanical stress.

Accordingly, the present invention is directed to a wafer level cover cap for semiconductor wafer devices. According to the method and apparatus of one embodiment of the invention, a cover wafer of material that is at least one of photo-etchable or transparent is patterned and attached to a device substrate to form an assembly. The cover wafer may be patterned either before or after being attached to the device substrate to form the assembly. Additionally, the cover wafer may be attached to the device substrate, for example, by coating either or both of the cover wafer and the device substrate with an appropriate adhesive.

Preferably, the cover wafer is made from a photo-etchable material so that portions of the cover wafer may be selectively sensitized and etched. In this manner, one or more cover caps may be defined in the cover wafer, such that each cover cap corresponds to a respective device on the device substrate.

Additionally, in one example of a cover cap according to the invention, the cover wafer may be patterned so as to define various optical components integrated with the cover caps. For example, the optical components may include diffractive microlenses or filters, which would be advantageous for many image sensing applications.

While particularly advantageous for applications involving image sensors, a cover cap for semiconductor wafer devices according to the invention would provide several advantages for a number of semiconductor applications, including those related to micro-mechanical devices. For example, using a photo-etchable material for the cover wafer provides for ease of patterning of specific areas of the cover wafer corresponding to respective devices on the device substrate, either before or after the cover wafer is attached to the device substrate to form an assembly. Additionally, whether patterned before or after the assembly is formed, the cover wafer provides protection to the entire device substrate during the dicing and packaging processes.

In particular, a cover wafer attached to the device substrate prior to dicing and packaging provides more robust devices by preventing particles from collecting over sensitive surfaces of the devices and scratching these surfaces. As a result, the method and apparatus of the invention allows for dicing of the assembly into individual devices and packaging the devices without the need for special cleanroom facilities. Additionally, particularly in connection with image sensor applications, covering an entire device substrate with a cover wafer eliminates the need to specially handle individual pieces of glass for each device, and therefore reduces expenses associated with piece-wise device transportation and storage, inspection, and application of bonding agents such as adhesives.

In one aspect, the method of fabricating semiconductor wafer devices having a cover cap according to the invention includes selectively sensitizing regions of a photo-etchable cover wafer to define one or more cover caps which form a cover configuration. The cover wafer is selectively sensitized, for example, by exposing selected portions of the cover wafer, which have been masked using known photoresist techniques, to a radiation source. The step of exposing the cover wafer to a radiation source may be followed by a step of heat-treating the cover wafer. The exposing and heat-treating steps are employed to alter physical properties of the cover wafer, or "selectively sensitive" portions of the cover wafer. The selectively sensitized cover wafer is then etched with an etchant to produce the cover configuration including one or more cover caps. The cover configuration, as patterned in the cover wafer, may additionally include a plurality of connective support beams which interconnect a plurality of cover caps.

In another aspect, the cover wafer is attached to the semiconductor device substrate using an adhesive, either before or after the cover wafer is patterned to form the cover configuration. Preferably, the adhesive is curable by heat using a temperature that minimizes a thermal expansion mismatch between the cover wafer and the device substrate. The adhesive may be applied to at least a portion or an entire surface of either the cover wafer or the device substrate. Furthermore, the adhesive may be applied in one or more contour patterns, such that each contour pattern essentially corresponds to a perimeter of a respective device on the device substrate. In this manner, an active area of each device remains substantially free of the adhesive. The contour patterns of adhesive may be applied, for example, by screen printing.

In another aspect, at least one of the devices of the device substrate is an image sensor. In this aspect, the cover wafer is optically transparent and includes at least one polishable, substantially optically flat, and substantially scratch-resistant surface. For image sensor applications in which an adhesive is used to attach the cover wafer or configuration to the device substrate, the adhesive is preferably optically transparent and has a refractive index that is related to, or "matched" to, the refractive index of the cover wafer, such that reflections of radiation incident to the image sensor are minimized.

In another aspect, the assembly of the cover configuration and the device substrate is diced into one or more devices, such that each device includes a portion of the cover configuration as the cover cap. The diced devices are then packaged using a variety of techniques. A diced device may be packaged by encapsulating the diced device in a molded plastic package such that the cover cap is exposed, by assembling the diced device on a ball-grid array using glob-top encapsulation of any wires attached to the diced device, or attaching the diced device to a printed circuit board using at least one solder ball, wherein the thickness of the cover cap is less than the diameter of the solder ball.

Other advantages, novel features and objects of the invention will become apparent from the following detailed description of the invention when considered in conjunction with the accompanying drawings.

BRIEF DESCRIPTION OF THE DRAWINGS

The accompanying drawings are not intended to be drawn to scale. In the drawings, each identical or nearly identical component that is illustrated in various figures is represented by a like numeral. For purposes of clarity, not every component may be labeled in every drawing.

In the drawings.

Figure 1:
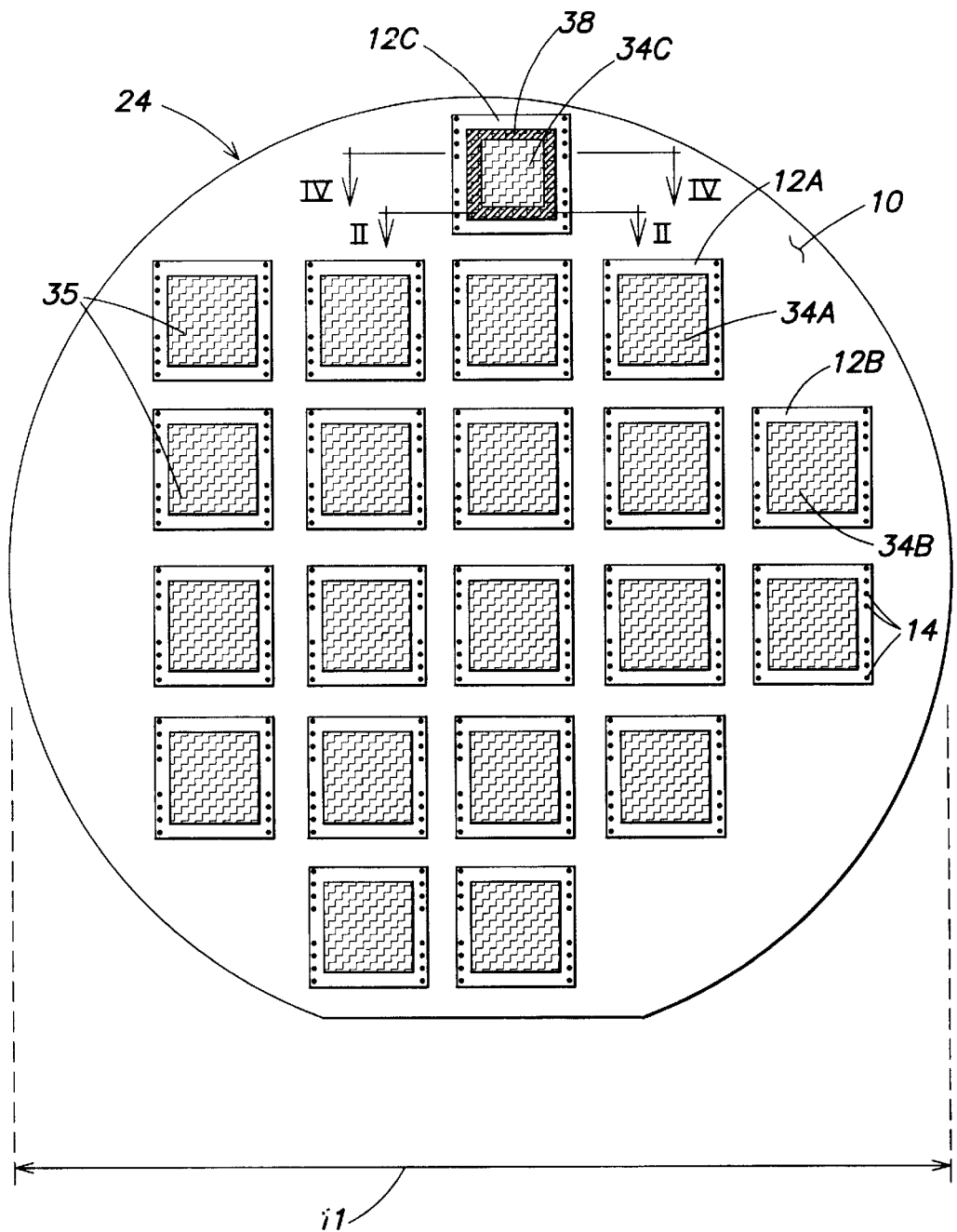
FIG. 1 is a diagram of a top view of an assembly according to an embodiment of the invention, illustrating a cover wafer that is patterned after being attached to a device substrate.
Figure 3:
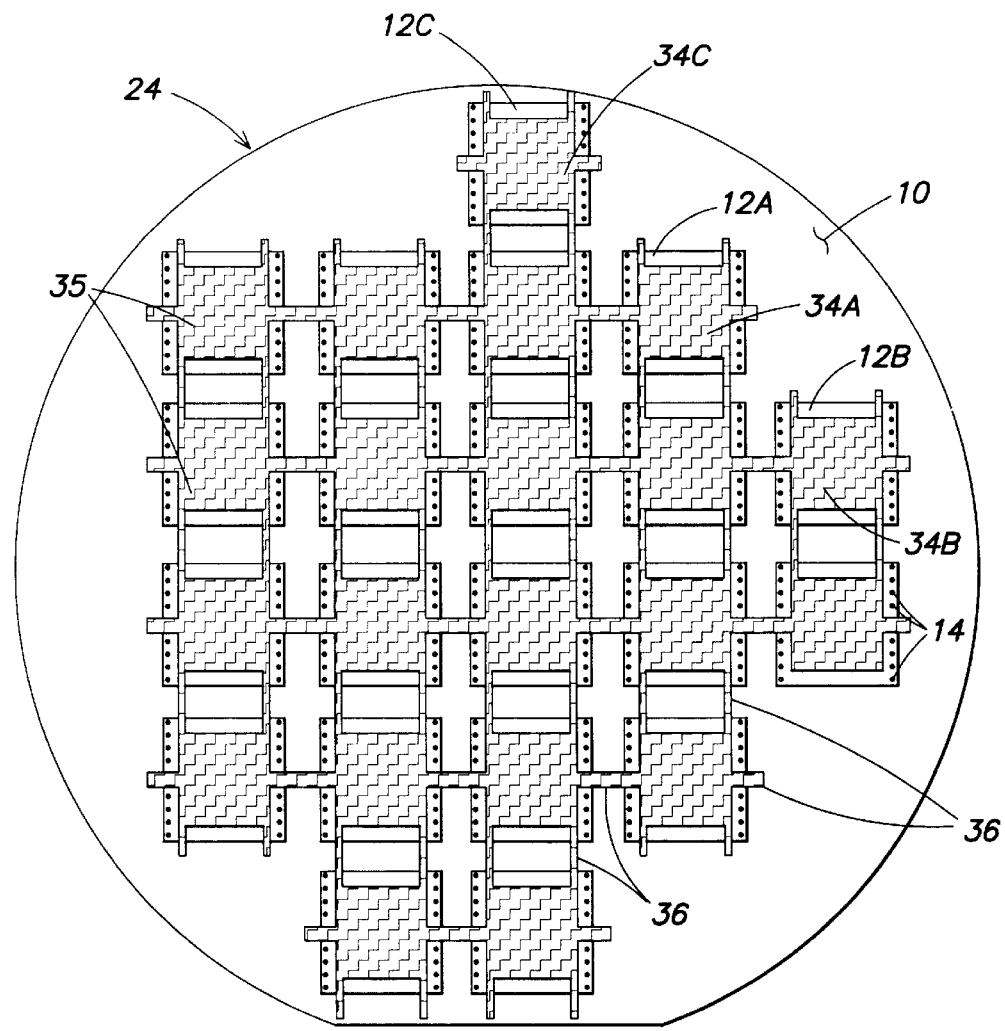
Figure 4:
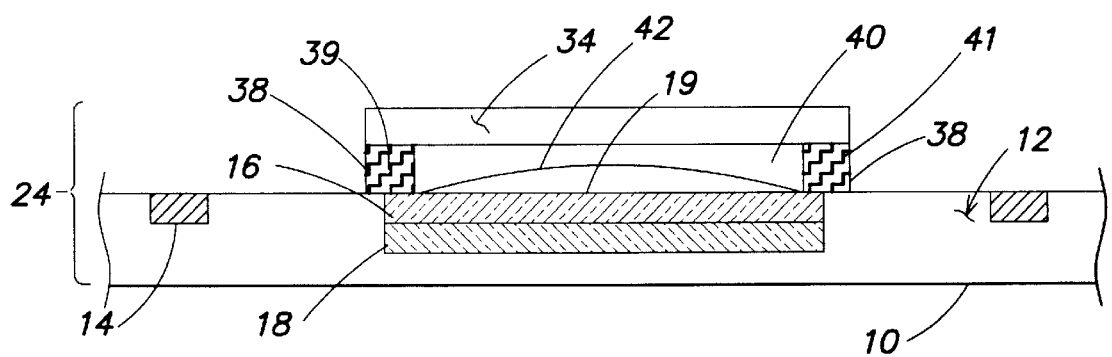
Figure 5:
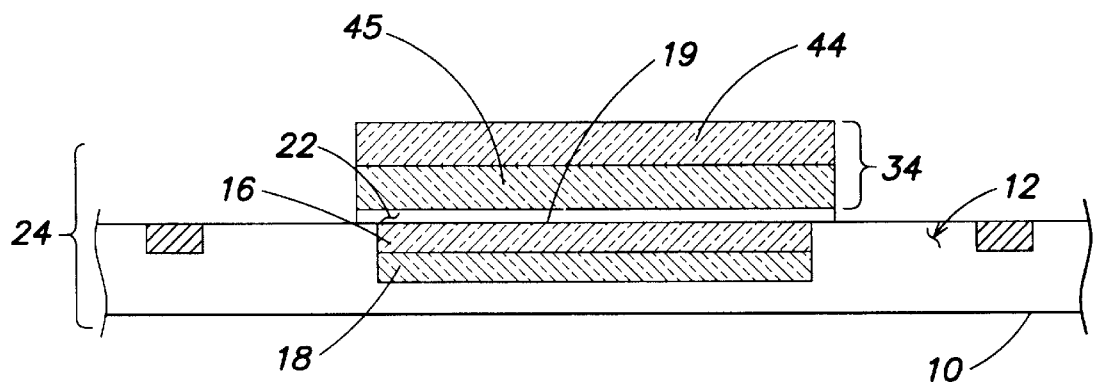
Figure 6:
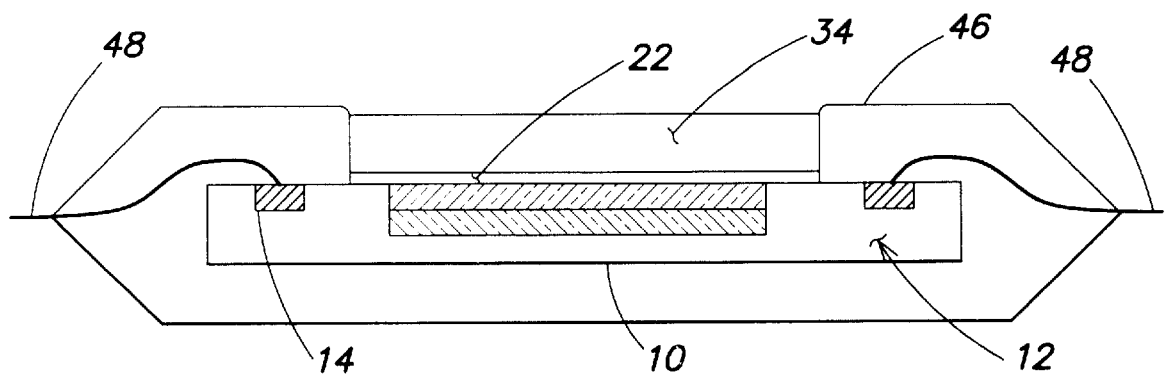
Figure 7:
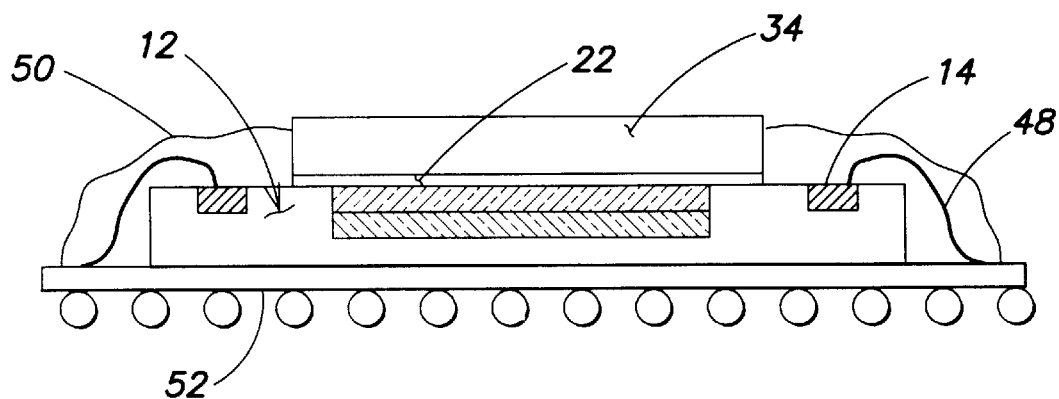
Figure 8:
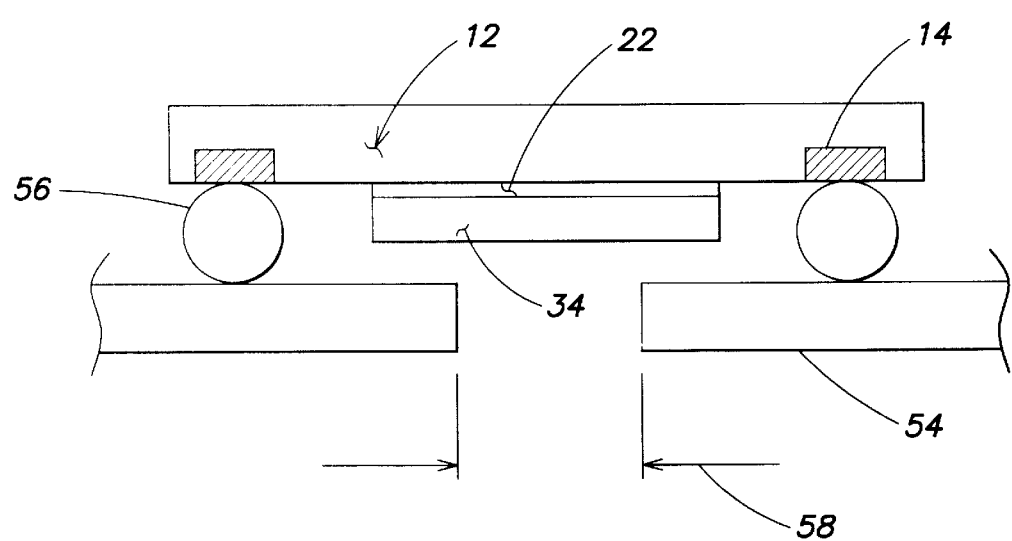

Each of FIGS. 2A–E is a cross-sectional view along the line II—II of FIG. 1, showing in temporal order an exemplary method of fabricating a cover cap for semiconductor wafer devices according to an embodiment of the invention;

FIG. 3 is a diagram of a top view of the assembly according to an embodiment the invention, illustrating a cover wafer that is patterned prior to being attached to the device substrate;

FIG. 4 is a cross-sectional view taken along line IV—IV of FIG. 1, illustrating a device having a cover cap attached to the device by a contour pattern of adhesive according to an embodiment of the invention;

FIG. 5 is a generic cross-sectional view of an image sensor having a cover cap, in which the cover cap includes at least one optical element according to one embodiment of the invention;

FIG. 6 is a generic cross-sectional view of a semiconductor device having a cover cap that is encapsulated in a molded plastic package according to one embodiment of the invention;

FIG. 7 is a generic cross-sectional view of a semiconductor device having a cover cap that is assembled on a ball-grid array using glop-top encapsulation according to one embodiment of the invention; and FIG. 8 is a generic cross-sectional view of a semiconductor device having a cover cap that is packaged as a component on a printed circuit board according to one embodiment of the invention.

DETAILED DESCRIPTION

FIG. 1 illustrates a top view of an assembly 24 according to an embodiment of the invention, including a cover configuration 35 that is patterned from a cover wafer (not shown) and attached to a device substrate 10. The cover configuration 35 is shown in FIG. 1 as a plurality of cover caps 34A, 34B, 34C, etc. Device substrate 10 includes a number of individual devices 12A, 12B, 12C, etc., each having an active area (not shown) below a respective cover cap 34A, 34B, 34C, etc. FIG. 1 also shows that each device 12 may have a plurality of wire-bond pads 14 to provide electrical connections to the device, if necessary.

Each of FIGS. 2A–E is a cross-sectional view along the line II—II of FIG. 1, showing in temporal order an exemplary method of fabricating semiconductor wafer devices having a cover cap according to the invention. The semiconductor device 12 illustrated in FIGS. 2A–E is shown for purposes of illustration as an image sensor fabricated from a semiconductor wafer substrate 10. It will be readily appreciated by one of ordinary skill in the art that any number of devices other than an image sensor, fabricated from a semiconductor wafer and/or residing on a semiconductor wafer substrate or other device substrate, may also include a cover cap according to the present invention.

FIGS. 2A–E show a portion of device substrate 10 in which a single image sensor 12 is fabricated. For purposes of illustration, the image sensor 12 includes wire-bond pads 14 which allow for electrical connections to the image sensor, a color filter 16 exposed to a top surface 19 of the device substrate 10, and an optical detector 18 disposed below color filter 16. Similar to many semiconductor devices, the surface 19 of image sensor 12 is fragile and may be easily damaged. In particular, the color filter 16 may be easily scratched or contaminated by particulates such as dust, moisture, and various agents, such as solvents, used during conventional semiconductor fabrication processes. Any damage to the color filter 16 will degrade the performance of the image sensor 12, and more specifically, adversely affect the detection capabilities or "sensitivity" of optical detector 18. Additionally, if damage to color filter 16 is severe enough, for example a deep scratch, optical detector 18 may itself be damaged directly, perhaps to the extent of failure.

Figure 2A:
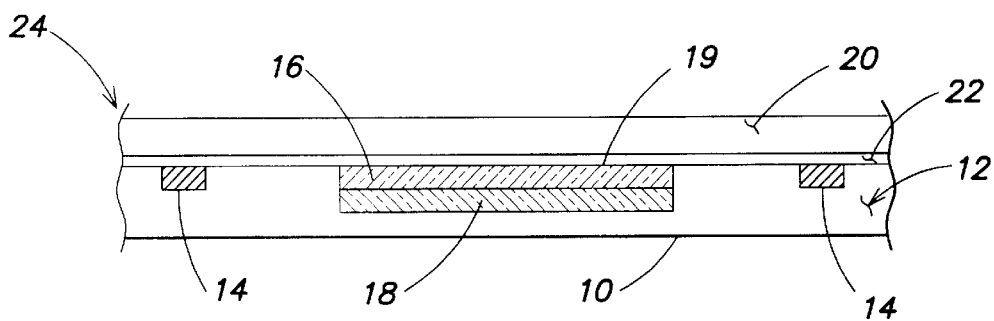

To protect the devices on device substrate 10, FIG. 2A shows that a cover wafer 20 is attached to the device substrate 10, above the surface 19 on which the color filter 16 of image sensor 12 is exposed, to form an assembly 24. In general, the cover wafer 20 may have a diameter essentially equal to a diameter 11 of the device substrate 10 (shown in FIG. 1). Furthermore, the cover wafer 20 is "patternable" in that it may be patterned to form a variety of cover configurations, as discussed further below. Cover wafers suitable for purposes of the invention should additionally have mechanically robust properties that are maintained after any patterning or etching of the cover wafer. Particularly for image sensor applications, the cover wafer 20 should also be optically transparent, and include at least one polishable, substantially optically flat and substantially hard, scratch-resistant surface.

As discussed above, the cover wafer 20 is preferably patternable and, in particular, should be "photo-etchable." For purposes of the present invention, a "photo-etchable" material refers to a material that can be selectively sensitized, for example, a material whose physical properties can be altered by exposure to radiation. Once a photo-etchable material is selectively sensitized, it may be etched by an etchant to form a pattern based on the sensitized regions. Some examples of cover wafer materials suitable for purposes of the present invention include, but are not limited to, a photo-etchable glass-like material such as FOTURAN wafers, manufactured by Schott Corp. or Mikroglas GmbH, or Fotoform or Fotosaran, manufactured by Corning Inc.

As shown in the exemplary method illustrated in FIGS. 2A–E, cover wafer 20 is patterned to form a cover configuration, in which are defined one or more cover caps 34. Each cover cap 34 covers and protects a respective device 12 on the device substrate 10. For purposes of illustration, the method outlined in FIGS. 2A–E shows that the cover wafer 20 is patterned and etched to form the cover configuration including cover cap 34 after the cover wafer 20 has been attached to device substrate 10 to form assembly 24. However, it should be appreciated that the method steps illustrated in FIGS. 2A–E may be applied to cover wafer 20 to form the cover configuration before the cover wafer 20 is attached to the device substrate 10. In either case, according to the invention, the cover wafer 20, whether or not patterned, is attached to the device substrate 10 before the device substrate is diced into individual devices.

FIG. 2A also shows that cover wafer 20 may be attached, before or after patterning, to device substrate 10 using an adhesive 22. For a given application, an adhesive may be selected that is compatible with the surface 19 of the devices 12. For example, in the case of an image sensor 12 shown in FIGS. 2A–E, the adhesive 22 should be compatible with the color filter 16. In particular, many known color filters employed in image sensor fabrication are highly soluble in several common solvents, and may be incompatible with adhesives that contain trace amounts of solvents or that give off solvents during cure. Examples of adhesives suitable for purposes of the invention, and in particular image sensor applications, include, but are not limited to, inorganic solders such as indium based solders, and silicone or acrylic adhesives. In general, the adhesive is preferably curable by heat using a temperature that minimizes a thermal expansion mismatch between the cover configuration and the device substrate, so as to avoid any damage that may result from thermally induced mechanical stress.

For the particular process outlined in FIGS. 2A–E, in which the device substrate 10 includes image sensor 12, adhesive 22 should not only be compatible with the surface 19 of the image sensor, and in particular color filter 16, but should also be an optically transparent adhesive. Furthermore, the refractive index of adhesive 22 is preferably related or "matched" to the refractive index of the cover wafer 20 in a known manner, such that any reflections of radiation incident to the image sensors are advantageously minimized.

Figure 2B:
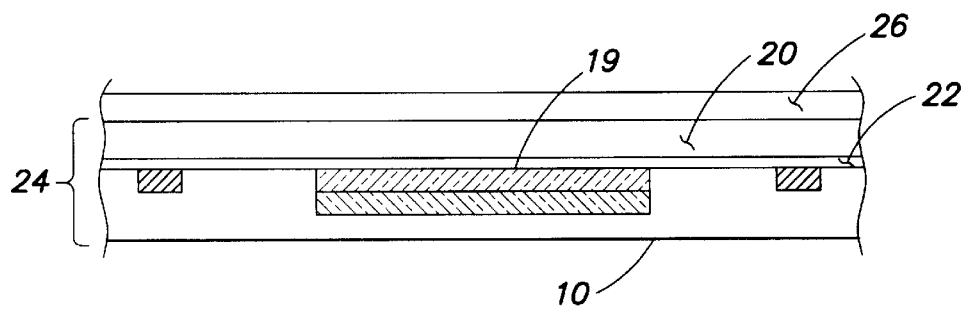
Figure 2C:
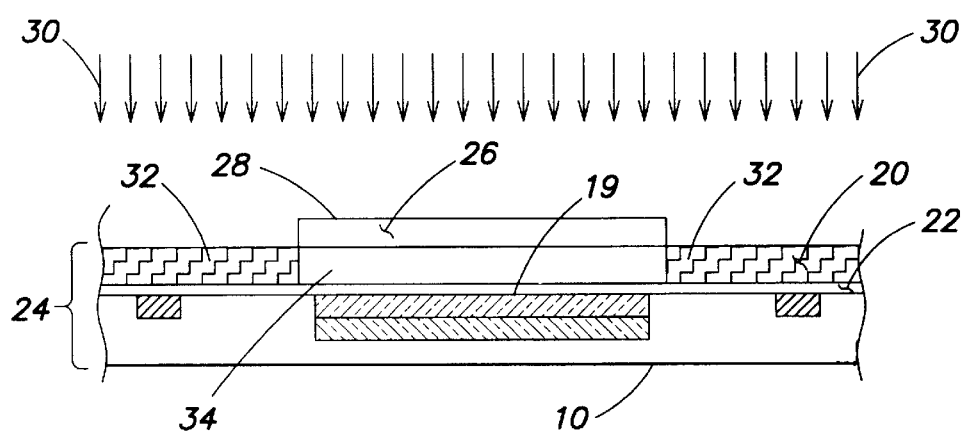

FIG. 2B shows that a first processing step in the exemplary method for patterning a cover wafer according to an embodiment of the invention begins with a step of coating the cover wafer 20 with a photoresist 26. FIG. 2C shows that some of the photoresist 26 is then selectively removed from portions of the cover wafer 20, using known methods, to form an exposure mask 28. FIG. 2C also shows that the cover wafer 20 covered with exposure mask 28 is subsequently exposed with radiation, indicated in FIG. 2C by a row of downward arrows 30, from a sensitizing source (not shown) to form selectively sensitized regions 32 in the cover wafer 20. In this example, portions of the cover wafer 20 that are blocked from the radiation 30 by exposure mask 28 are not sensitized. As discussed above, the method for patterning a cover wafer by selectively sensitizing regions of the wafer, as shown in FIGS. 2B and 2C, may be accomplished either before or after the cover wafer is attached to the device substrate 10.

If the cover wafer 20 is a material such as Schott Corp's FOTURAN, for example, a suitable sensitizing source may be an ultraviolet radiation source. In the FOTURAN material, ultraviolet radiation forms silver atoms in areas of the material exposed to the radiation. The ultraviolet exposure is typically followed by a heat treatment at a temperature between 400° and 500° C. (not shown in FIG. 2C), during which the silver atoms begin to agglomerate and ultimately undergo crystallization.

Figure 2D:
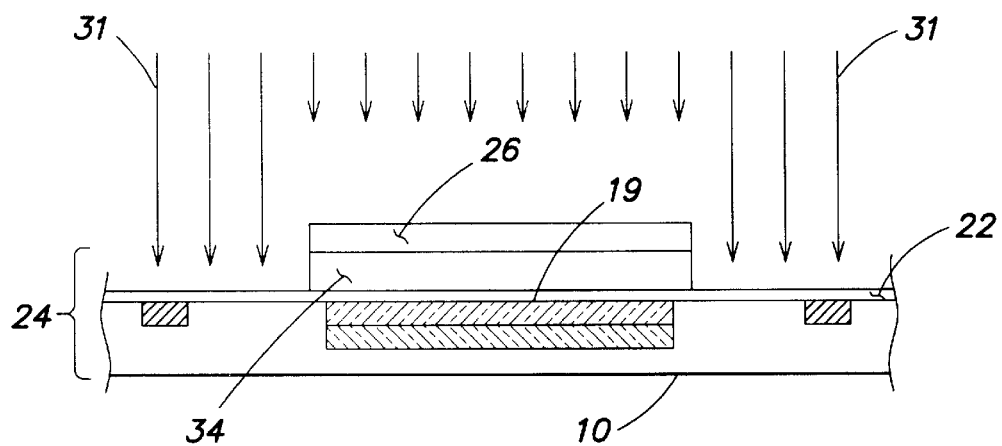

Once regions 32 of cover wafer 20 have been selectively sensitized, FIG. 2D shows that the cover wafer is selectively patterned by etching the cover wafer with an appropriate etchant, indicated by downward arrows 31, that dissolves the selectively sensitized regions 32. Again, as discussed above, the step of etching may be accomplished either before or after the cover wafer 20 is attached to the device substrate 10. A solution of hydrofluoric acid may serve as an appropriate etchant, especially in connection with FOTURAN cover wafers, in which a 10% solution of hydrofluoric acid in water will etch the selectively sensitized crystalline silver regions at an etching rate that is 10–15 times higher than that of the unexposed regions of the FOTURAN cover wafer. Once patterned and etched, FIG. 2D shows that the cover wafer forms a cover configuration including a cover cap 34. As shown in FIGS. 1 and 3, the cover configuration 35 may include a number of cover caps 34 corresponding to a respective device 12 of the device substrate 10.

Figure 2E:
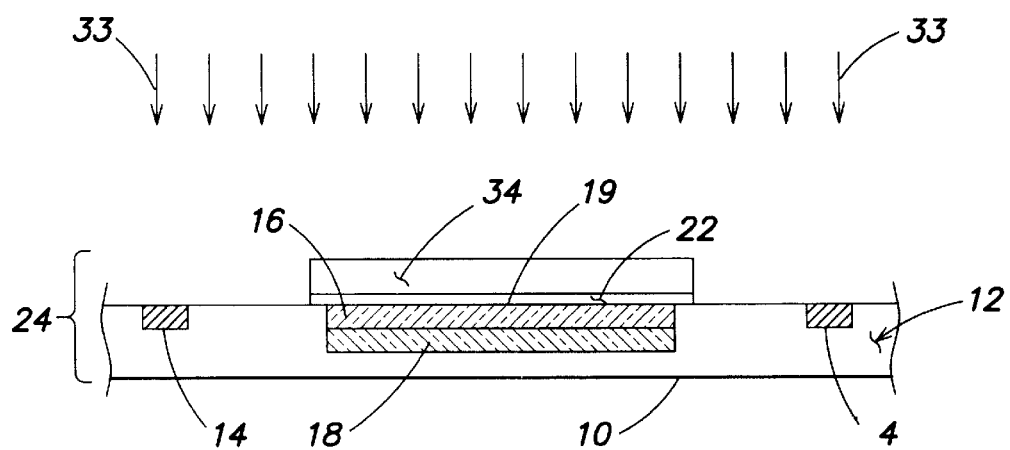

FIG. 2E shows that any exposed surface of the assembly 24 after etching by etchant 31 is exposed to a plasma etch, illustrated by downward arrows 33, to remove excess photoresist 26 and/or adhesive 22. As shown in FIG. 2E, after the plasma etch 33 is performed, wire-bond pads 14 are exposed at a portion of the surface 19 of device substrate 10, while the color filter 16 and optical detector 18 of the image sensor 12 are protected by cover cap 34 attached to the device substrate 10 by adhesive 22.

FIG. 3 shows a top view of assembly 24, similar to that of FIG. 1, in which the cover wafer is alternatively patterned and etched to form a cover configuration 35 before being attached to device substrate 10. FIG. 3 shows one example of such a cover configuration 35 which, in addition to a plurality of patterned cover caps 34 covering respective devices 12 of device substrate 10, includes a plurality of connective support bars 36 to interconnect the plurality of individual cover caps 34.

With respect to FIGS. 1 and 3, and the exemplary method according to an embodiment of the invention illustrated in FIGS. 2A–E, if an adhesive is used to attach either an unpatterned cover wafer, or a cover wafer patterned to form a cover configuration, to a device substrate to form an assembly, either the cover wafer or the device substrate may be coated with the adhesive. In some cases, an entire surface of either the cover wafer or the device substrate is covered with the adhesive to ensure an adequate bond.

Alternatively, as shown in FIG. 1, the adhesive may be applied to either the cover wafer or the device substrate in one or more contour patterns 38, shown as a darkened portion within device 12C of FIG. 1. The shape of each contour pattern 38 essentially corresponds to a perimeter of an "active area" on the surface of a respective device 12. By applying the adhesive as one or more contour patterns 38, the active area of the surface of each device 12 remains substantially free of adhesive. Additionally, a "stand-off height" can be made with the contour pattern of adhesive to allow a gap between a cover cap and an active area of a respective device, wherein the gap has a predetermined thickness corresponding to the thickness of the contour pattern of adhesive. Contour patterns 38 may be applied to either the cover wafer or the device substrate using a screen-printing process, as known in the art.

FIG. 4 shows another example of an image sensor 12 fabricated from a device substrate 10 and having a cover cap 34, in which the cover cap is attached to the device substrate by a contour pattern of adhesive 38, as discussed above. FIG. 4 is a cross-sectional view of a single device 12 as shown in FIG. 1, taken along the lines IV—IV. In FIG. 1, for purposes of illustration, the contour pattern of adhesive 38 is shown as a darkened portion within a region occupied by the cover cap 34C. However, as can be seen in FIG. 4, contour pattern 38, again shown as a darkened region for purposes of illustration, is actually disposed below the cover cap 34. It should be appreciated that, while FIG. 4 shows a specific device example of an image sensor, contour pattern 38 may be used in conjunction with devices other than image sensors.

As viewed from the perspective shown in FIG. 4, the contour pattern of adhesive 38 appears as two individual "stand-offs" of adhesive 39 and 41 that support cover cap 34 above an air gap 40. The configuration shown in FIG. 4 would be useful, for example, in image sensor applications in which an adhesive or bonding agent other than an optically transparent adhesive is used to attach a cover wafer or configuration to a device substrate. In such a case, there would be no need for an optically transparent adhesive, nor would it be necessary to "match" a refractive index of the adhesive to a refractive index of the cover wafer to minimize reflections, as discussed earlier. Additionally, requirements for the adhesive to be compatible with the surface 19 of a device, such as color filter 16 of image sensor 12, would be less stringent. Furthermore, in general, the contour pattern 38, illustrated in FIG. 4 as stand-offs 39 and 41, would allow a cover cap according to the invention to be implemented with micro-machined devices or MEMS having microscopic moving mechanisms, whose movement would be otherwise obstructed by a continuous layer of adhesive.

The configuration shown in FIG. 4 would also be useful for specific image sensor applications employing an optional microlens 42, fabricated on the surface 19 of image sensor 12 above color filter 16. In a conventional image sensor fabrication process, individual microlens elements 42 may be fabricated over an array of image sensors in a device substrate using known methods, for example, by coating and patterning of photoresist using laser beam writing.

A microlens may be used in conjunction with an image sensor to increase the overall sensitivity of the sensor. In general, the shape of the microlens affects any increase in sensitivity of the sensor. A conventional fabrication process of a device substrate of image sensors incorporating microlenses often includes special planarization steps to insure an optically flat surface of the device substrate prior to microlens formation steps.

In many cases, the material properties of the microlenses are similar to those of the color filters 16 and, hence, the microlenses are similarly prone to damage and deterioration, and are similarly sensitive to some adhesives, especially those including solvents. Additionally, since microlens shape affects sensor sensitivity, a substantially continuous layer of adhesive covering the surface 19 of the image sensor 12, as shown in FIGS. 2A–E, would be disadvantageous for devices which optionally include a microlens. However, by employing the scheme illustrated in FIG. 4, in which the adhesive is applied in one or more contour patterns 38 allowing for air gap 40, a cover cap according to the invention may be implemented to protect devices that include microlenses without adversely affecting the advantages provided by the microlenses.

According to another aspect of the invention particularly advantageous for image sensor applications, one or more optical elements may be defined in the cover wafer, in conjunction with the cover caps, to form the cover configuration attached to the device substrate. FIG. 5 is a generic cross-sectional view of an image sensor having a cover cap that includes at least one optical element according to an embodiment of the invention. FIG. 5 shows a first optical element 44 defined in an upper surface of cover cap 34. Alternatively, or in combination with first optical element 44, FIG. 5 also shows that a second optical element 45 may be defined in a lower surface of cover cap 34, adjacent to the adhesive 22. While FIG. 5 shows a continuous layer of adhesive 22 covering an entire active area on surface 19 of image sensor 12, as defined for example by color filter 16, the adhesive 22 may be applied as one or more contour patterns 38, as discussed above in connection with FIG. 4.

With respect to FIG. 5, the optical elements 44 and 45 may be, for example, diffractive micro-optical elements. Essentially, diffractive micro-optical elements are fabricated by etching very small scale features, for example, micron scale features or smaller, onto a surface of the cover wafer. Such small scale features interact with radiation, such as light, in useful ways. In general, diffractive micro-optical elements divide incoming light waves into large numbers of smaller "wavelets," which recombine to form a "new" lightwave in a manner determined by the specific design of the micro-optical element. The light wave entering the diffractive micro-optical element is divided by the very small scale features etched onto the surface of the cover wafer. These microscopic patterns typically resemble miniature stairs whose size and proximity to each other determine how the incoming light is affected.

The microscopic features of a particular diffractive micro-optical element may be defined in a manner similar to that described in connection with the patterning of the cover wafer, as illustrated in FIGS. 2A–E. Examples of diffractive micro-optical elements that may be implemented according to the present invention include, but are not limited to, diffractive microlenses, reflection elements, or color filters. Other known examples of diffractive micro-optical elements suitable for purposes of the present invention include those that can convert a single input radiation beam into several output beams, focus an input beam to a point or a pattern, homogenize a beam, diffuse a beam into a controlled area, or deflect a beam at a specific angle.

Alternatively, optical elements 44 and 45 may be patterned dichroic filters. Dichroic filters are fabricated by depositing thin layers of materials with varying refractive indices. These filters can be made as band-pass filters, allowing only certain wavelengths of light to pass and reflecting other wavelengths of light. Such dichroic filters are typically compatible with conventional optically transparent adhesives, and are additionally very rugged and can be fabricated on either side of the cover wafer.

Implementing a dichroic filter with a cover cap according to the invention would be advantageous even if a conventional color filter 16 is employed with image sensor 12. In particular, most image sensors require an infrared blocking filter in addition to color filter 16. Hence, it would be desirable, for example, to include a dichroic infrared blocking filter as an optical element 44 or 45 integrated with a cover cap 34 to alleviate the need for a discrete infrared blocking filter.

Additionally, some high performance image sensors require an aperture near the surface of the sensor to prevent stray light from reaching the sensor. Accordingly, for some high performance applications, optical elements 44 and 45 may include an opaque coating on peripheral regions of cover cap 34 beyond the light sensitive regions of image sensor 12. Such apertures can be fabricated using dichroic filters, as discussed above, or by depositing a metal layer, such as chrome, in a contour pattern around the perimeter of the cover cap 34 as defined in the cover wafer.

Once a cover wafer is patterned to form a cover configuration and attached to a device substrate to form an assembly 24, the assembly is then diced into one or more individual devices, such that each device includes a portion of the cover configuration as a cover cap. Once separated from the device substrate by dicing, the individual devices may then be packaged. FIGS. 6–8 are generic cross-sectional views of devices which illustrate three example techniques of packaging a semiconductor device having a cover cap according to an embodiment of the invention.

FIG. 6 illustrates that each of the diced devices, shown for example as an image sensor 12 having a cover cap 34, may be encapsulated in a molded plastic package 46, such that the cover cap 34 is exposed. As illustrated in FIG. 6, wires 48 are bonded to wire-bond pads 14 prior to encapsulation of device 12 in molded plastic package 46.

Alternatively, FIG. 7 shows that wires 48 may be attached to wire-bond pads 14 of device 12 using a glop-top encapsulation 50 of wires 48, as known in the art. Glop-type encapsulation 50 also serves to assemble each device on a ball-grid array 52, used for "chip-on-board" assemblies, as also known in the art.

FIG. 8 illustrates yet another alternative packaging technique according to the invention, in which device 12 is attached to a printed circuit board 54 using at least one solder ball 56 connected to respective wire-bond pad 14. Printed circuit board 54 includes an opening 58 to expose cover cap 34 attached to device 12. In this packaging technique, a thickness of cover cap 34 is less than a diameter of the solder balls 56, so that the cover cap 34 is not inadvertently damaged by contact with printed circuit board 54. This packaging technique would be particularly advantageous for integrating discrete semiconductor devices, such as image sensors, on a printed circuit board which further includes various circuitry for processing signals obtained from the semiconductor device.

Having thus described at least one illustrative embodiment of the invention, various alterations, modifications and improvements will readily occur to those skilled in the art. Such alterations, modifications, and improvements are intended to be within the spirit and scope of the invention. Accordingly, the foregoing description is by way of example only and is not intended as limiting.

What is claimed is:

1. A method of fabricating semiconductor devices having a cover cap, comprising steps of:
   patterning a cover wafer to form a cover configuration, the cover wafer being at least one of photo-etchable and transparent; and
   attaching the cover configuration to a device substrate to form an assembly, the device substrate including at least one device, wherein:
   the cover wafer is photo-etchable; and
   the step of patterning includes a step of selectively sensitizing regions of the cover wafer,
   wherein the step of patterning further includes a step of etching the cover wafer with an etchant to selectively pattern the cover wafer based on the selectively sensitized regions,
   wherein the step of etching occurs before the step of attaching, and
   wherein the step of patterning further includes steps of:
   defining a plurality of cover caps in the cover wafer to form the cover configuration; and
   defining a plurality of connective support beams in the cover wafer to interconnect the plurality of cover caps.

2. The method of claim 1, wherein the step of defining a plurality of cover caps in the cover wafer to form the cover configuration includes a step of defining each cover cap of the plurality of cover caps to correspond to a respective one of the at least one device of the device substrate.

3. The method of claim 1, wherein the step of selectively sensitizing includes steps of:
   coating the cover wafer with a photoresist;
   selectively removing the photoresist from portions of the cover wafer to form an exposure mask; and
   exposing the cover wafer through the exposure mask with a sensitizing source to form the selectively sensitized regions.

4. The method of claim 3, wherein:
   the sensitizing source is an ultraviolet radiation source; and
   the step of exposing the cover wafer is followed by a step of heat-treating the cover wafer.

5. The method of claim 4, wherein the step of selectively sensitizing occurs before the step of attaching.

6. The method of claim 1, wherein the etchant is a solution of hydrofluoric acid.

7. The method of claim 1, further including a step of removing excess photoresist by exposing the assembly to a plasma etch after the steps of etching and attaching.

8. The method of claim 1, wherein the step of attaching includes a step of adhering the cover configuration to the device substrate using an adhesive.

9. The method of claim 5, wherein the adhesive is curable by heat using a temperature that minimizes a thermal expansion mismatch between the cover configuration and the device substrate.

10. The method of claim 5, wherein the adhesive is an inorganic solder.

11. The method of claim 5, wherein the step of adhering includes a step of coating one of at least a portion of the cover configuration and at least a portion of the device substrate with the adhesive.

12. The method of claim 11, wherein the step of coating includes a step of covering substantially an entire surface of the one of the cover configuration and the device substrate with the adhesive.

13. The method of claim 11, wherein the step of coating includes a step of applying at least one contour pattern of the adhesive to the one of the cover configuration and the device substrate, each contour pattern of the at least one contour pattern essentially corresponding to a perimeter of a respective one of the at least one device, such that an active area of each device of the at least one device is substantially free of the adhesive.

14. The method of claim 13, wherein the step of applying includes a step of screen-printing the one of the cover configuration and the device substrate with the at least one contour pattern.

15. The method of claim 11, further including a step of:
   removing excess adhesive by exposing the assembly to a plasma etch after the step of adhering.

16. The method of claim 1, wherein the at least one device includes at least one image sensor.

17. The method of claim 16, wherein the cover wafer is optically transparent and includes at least one polishable, substantially optically flat, substantially scratch-resistant surface.

18. The method of claim 17, wherein the step of patterning includes a step of defining at least one cover cap in the cover wafer to form the cover configuration, each cover cap of the at least one cover cap corresponding to a respective one of the at least one device.

19. The method of claim 18, wherein the step of defining at least one cover cap includes a step of further defining at least one optical element in the cover wafer to form the cover configuration.

20. The method of claim 19, wherein the at least one optical element is a diffractive micro-optical element.

21. The method of claim 19, wherein the at least one optical element is a filter.

22. The method of claim 16, wherein:

the step of attaching includes a step of adhering the cover configuration to the device substrate using an optically transparent adhesive; and a first refractive index of the adhesive is related to a second refractive index of the cover wafer, such that reflections of radiation incident to the image sensors are minimized.

23. The method of claim 16, wherein the image sensor includes a microlens to increase a sensitivity of the image sensor; and the step of attaching includes a step of applying at least one contour pattern of an adhesive to one of the cover configuration and the device substrate, each contour pattern of the at least one contour pattern essentially corresponding to a perimeter of a respective one of the at least one device, such that an active area of the image sensor including the microlens is substantially free of the adhesive.

24. An apparatus made at least in part using the method of claim 16, the apparatus comprising:

the at least one image sensor; and at least one cover cap of the plurality of cover caps defined in the photoetchable cover wafer.

25. The method of claim 1, further including a step of dicing the assembly into at least one diced device such that each diced device of the at least one diced device includes a portion of the cover configuration as the cover cap.

26. The method of claim 25, further including a step of packaging the at least one diced device.

27. An apparatus made at least in part using the method of claim 1, the apparatus comprising:

the at least one device of the device substrate; and at least one cover cap of the plurality of cover caps defined in the photoetchable cover wafer.

28. A method of fabricating semiconductor devices having a cover cap, comprising steps of:

patterning a cover wafer to form a cover configuration, the cover wafer being at least one of photo-etchable and transparent; and attaching the cover configuration to a device substrate to form an assembly, the device substrate including at least one device, wherein:

the cover wafer is photo-etchable; and the step of patterning includes a step of selectively sensitizing regions of the cover wafer, wherein the step of patterning further includes a step of etching the cover wafer with an etchant to selectively pattern the cover wafer based on the selectively sensitized regions, the method further including a step of dicing the assembly into at least one diced device such that each diced device of the at least one diced device includes a portion of the cover configuration as the cover cap, the method further including a step of packaging the at least one diced device wherein the step of packaging includes a step of encapsulating the at least one diced device in a molded plastic package such that the cover cap is exposed.

29. The method of claim 28, wherein the at least one device includes at least one image sensor.

30. An apparatus made at least in part using the method of claim 28, the apparatus comprising:

the at least one diced device including the cover cap; and the molded plastic package encapsulating the at least one diced device such that the cover cap is exposed.

31. A method of fabricating semiconductor devices having a cover cap, comprising steps of:

patterning a cover wafer to form a cover configuration, the cover wafer being at least one of photo-etchable and transparent; and attaching the cover configuration to a device substrate to form an assembly, the device substrate including at least one device, wherein:

the cover wafer is photo-etchable; and the step of patterning includes a step of selectively sensitizing regions of the cover wafer, wherein the step of patterning further includes a step of etching the cover wafer with an etchant to selectively pattern the cover wafer based on the selectively sensitized regions, the method further including a step of dicing the assembly into at least one diced device such that each diced device of the at least one diced device includes a portion of the cover configuration as the cover cap, the method further including a step of packaging the at least one diced device wherein the step of packaging includes steps of:

attaching at least one wire to the at least one diced device; and assembling the at least one diced device on a ball-grid array using glob-top encapsulation of the at least one wire.

32. The method of claim 31, wherein the at least one device includes at least one image sensor.

33. An apparatus made at least in part using the method of claim 31, the apparatus comprising:

the at least one diced device including the cover cap;

the at least one wire attached to the at least one diced device; and the ball-grid array including the glob-top encapsulation of the at least one wire.

34. A method of fabricating semiconductor devices having a cover cap, comprising steps of:

patterning a cover wafer to form a cover configuration, the cover wafer being at least one of photo-etchable and transparent; and attaching the cover configuration to a device substrate to form an assembly, the device substrate including at least one device, wherein:

the cover wafer is photo-etchable; and the step of patterning includes a step of selectively sensitizing regions of the cover wafer, wherein the step of patterning further includes a step of etching the cover wafer with an etchant to selectively pattern the cover wafer based on the selectively sensitized regions, the method further including a step of dicing the assembly into at least one diced device such that each diced device of the at least one diced device includes a portion of the cover configuration as the cover cap, the method further including a step of packaging the at least one diced device wherein the step of packaging includes a step of attaching the at least one diced device to a printed circuit board using at least one solder ball, wherein a thickness of the cover cap is less than a diameter of the at least one solder ball.

35. The method of claim 34, wherein the at least one device includes at least one image sensor.

36. An apparatus made at least in part using the method of claim 34, the apparatus comprising:

the at least one diced device including the cover cap;

the printed circuit board; and the at least one solder ball, wherein the thickness of the cover cap is less than the diameter of the at least one solder ball.

* * * * *